(12) United States Patent  (10) Patent No.: US 7,688,201 B2
Nebbia et al.  (45) Date of Patent: Mar. 30, 2010

(54) DETECTION DEVICE FOR VEHICLES

(75) Inventors: Fabio Nebbia, Casale Monferrato (IT);
Paolo Colombo, Casale Monferrato (IT);
Domenico Cantarelli, Casale
Monferrato (IT)

(73) Assignee: ELTEK S.p.A., Casale Monferrato
(Alessandria) (IT)

( * ) Notice: Subject to any disclaimer, the term of this
patent is extended or adjusted under 35
U.S.C. 154(b) by 247 days.

(21) Appl. No.: 12/028,544

(22) Filed: Feb. 8, 2008

(65) Prior Publication Data

US 2008/0190926 A1    Aug. 14, 2008

(30) Foreign Application Priority Data

Feb. 9, 2007   (IT) .......................... TO2007A0102

(51) Int. Cl.
*G08B 21/00*   (2006.01)
(52) U.S. Cl. ..................... 340/540; 340/541; 340/545.6;
340/568.1; 340/426.1; 340/438; 70/165; 70/167;
220/210; 220/288
(58) Field of Classification Search ................. 340/540,
340/541, 542, 545.6, 568.1, 426.1, 438; 70/165,
70/167, 210, 288; 220/210, 288
See application file for complete search history.

(56) References Cited

U.S. PATENT DOCUMENTS

| 2,084,045 | A | * | 6/1937 | Olsen | 220/86.2 |
| 4,000,632 | A | * | 1/1977 | Summan | 70/165 |
| 4,342,208 | A | * | 8/1982 | Evans | 70/165 |
| 4,754,627 | A | * | 7/1988 | Butler, III | 70/158 |

FOREIGN PATENT DOCUMENTS

GB   2343283 A   5/2000

* cited by examiner

*Primary Examiner*—Hung T. Ngyuen
(74) *Attorney, Agent, or Firm*—Heslin Rothenberg Farley &
Mesiti P.C.; Victor A. Cardona, Esq.

(57) ABSTRACT

A removable cap for fuel tanks of vehicles includes a gripping portion and a locking portion, operatively set between which is a key-operated locking device. In the closing condition of the device, a rotation movement imparted manually upon the gripping portion is not transferred to the locking portion, while in the opening condition of the device a rotation movement imparted manually upon the first part is transferred to the clamping portion. In the closing condition at least one component of the locking device is rotatable together with the gripping portion, and switching with the key of the locking device between the conditions of closing and opening causes an angular movement of the component with respect to the gripping portion, between a first pre-defined angular position and a second pre-defined angular position. The cap further includes a circuit arrangement that includes at least one sensor configured for detecting the relative angular movement between the component of the locking device and the gripping portion.

15 Claims, 3 Drawing Sheets

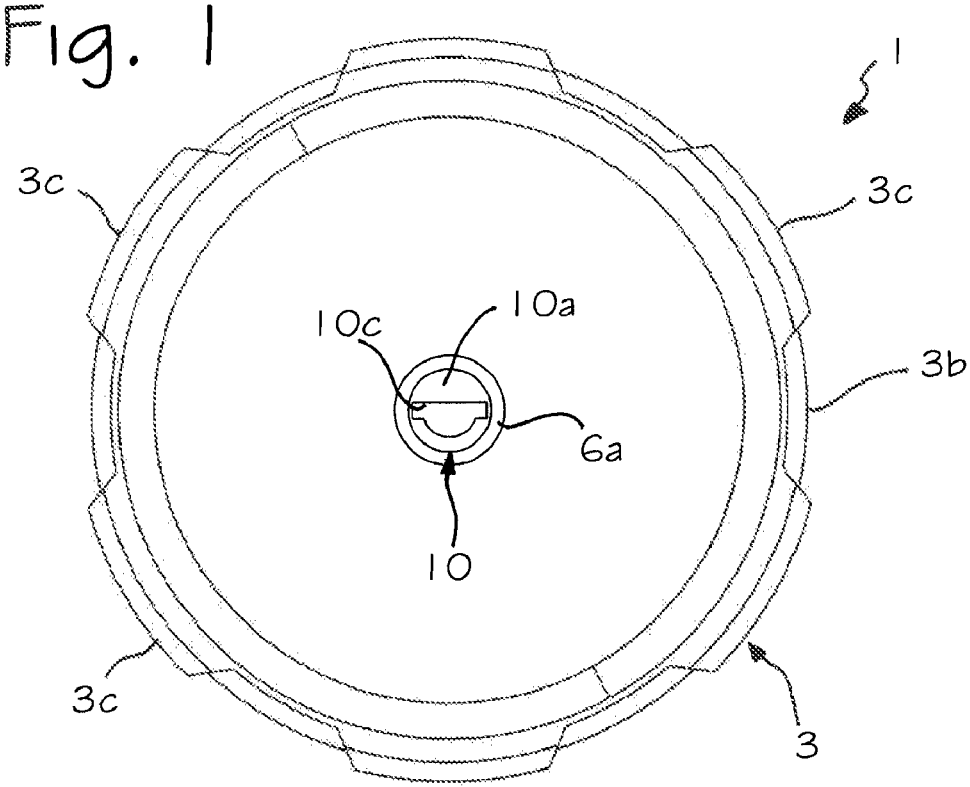
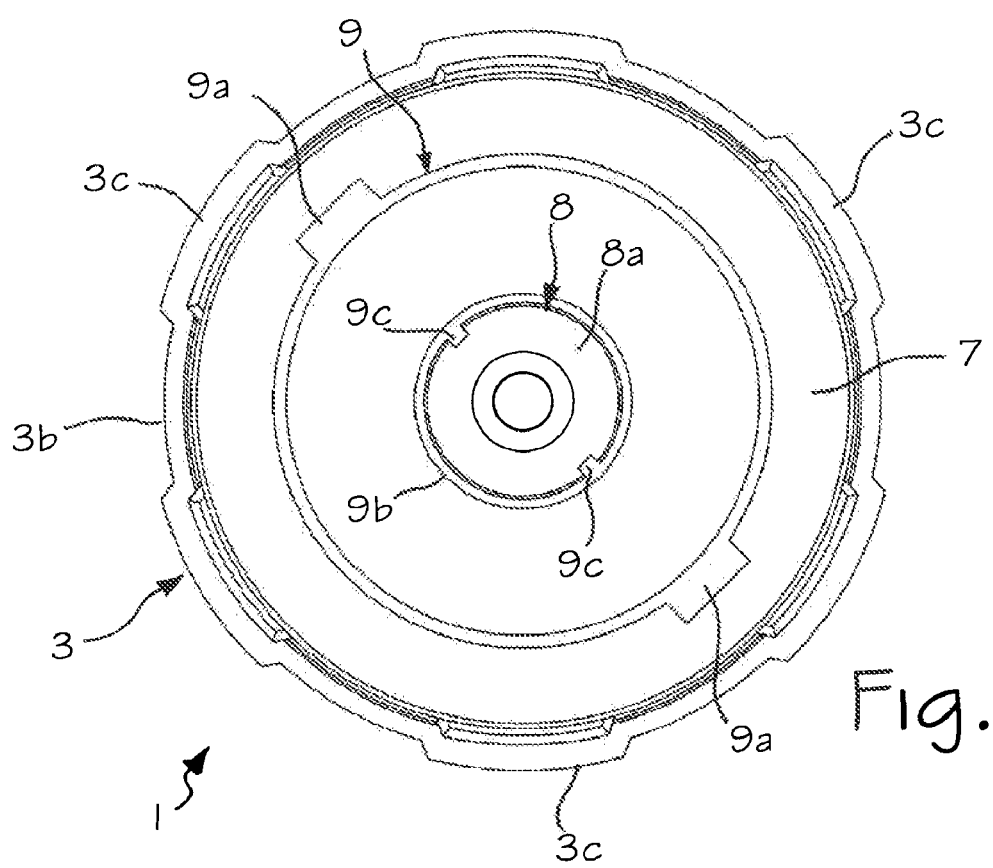

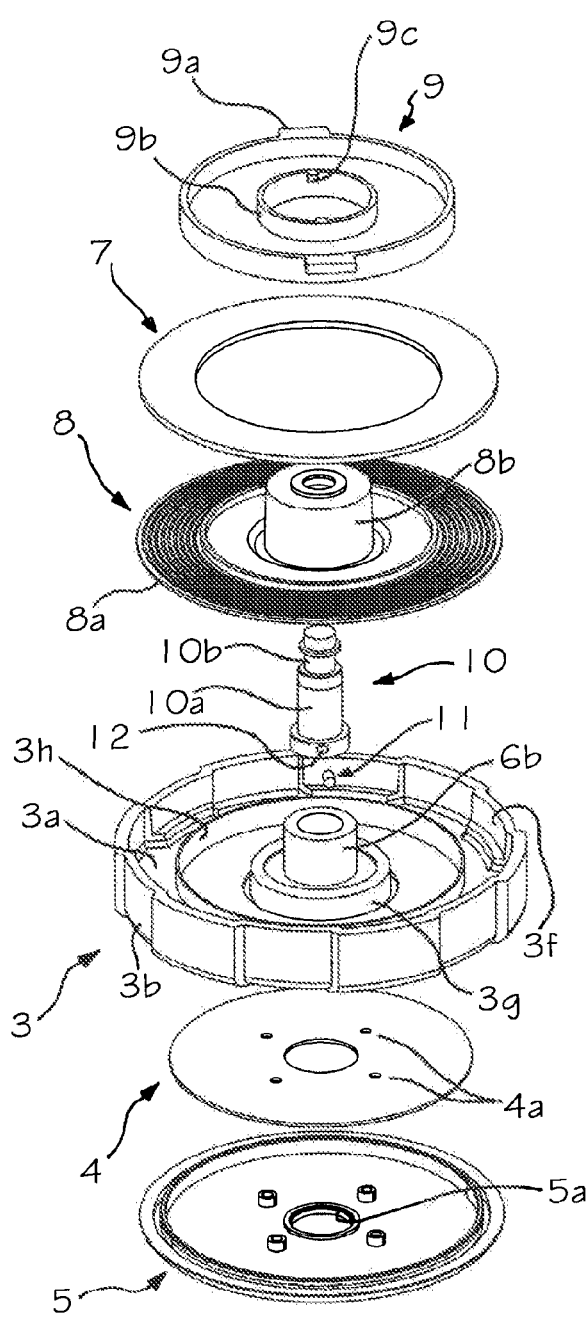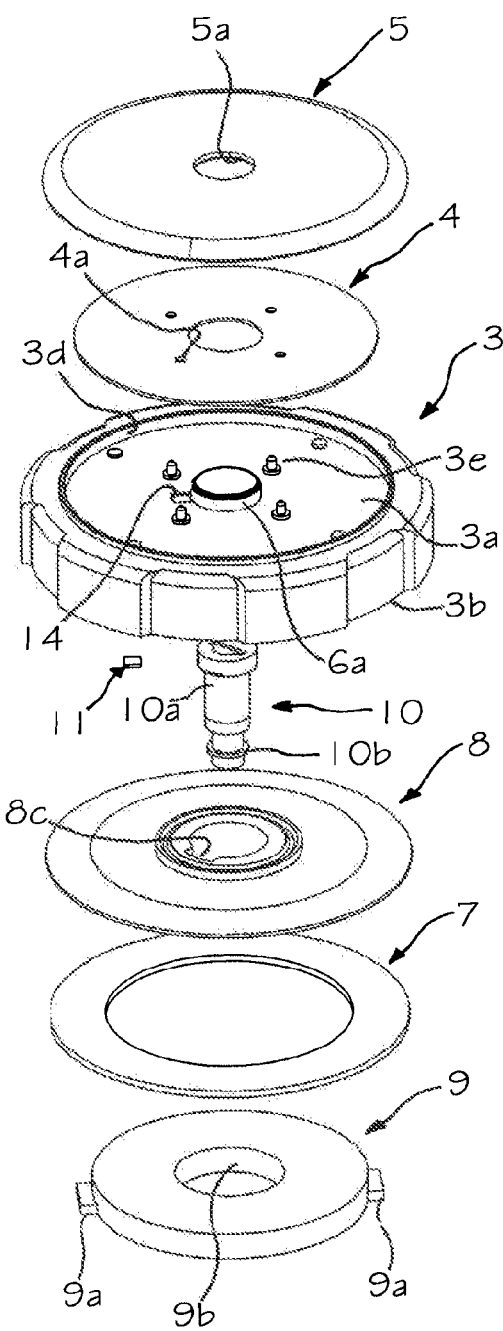

DETECTION DEVICE FOR VEHICLES

CROSS-REFERENCE TO RELATED APPLICATIONS

This application claims priority from Italian patent application No. TO2007A000102, filed on Feb. 9, 2007, the entire disclosure of which is incorporated herein by reference.

DESCRIPTION

1. Field of the Invention

The present invention relates to a detection device for vehicles and, more particularly, to a removable cap designed to occlude a filler of a fuel tank of a vehicle.

2. Background Art

In order to prevent fuel being stolen from a vehicle key-operated caps have been proposed. A cap of this type basically comprises a gripping portion, facing the outside of the filler of the fuel tank, and a locking or clamping portion, having coupling means which designed for co-operating with coupling means provided at the filler of the fuel tank. The coupling means referred to above are usually of a threaded or bayonet-coupling type.

The cap then comprises a locking device, which can be switched between a closing condition and an opening condition and comprises a component with a seat for a respective key. The device is operatively set between the gripping portion and the locking portion of the cap in such a way that, in the closing condition, a rotation movement imparted manually upon the gripping portion does not enable disengagement of the locking portion from the corresponding seat. Instead, in the opening condition of the locking device, the aforesaid rotation movement enables disengagement of the locking portion from its seat.

Key-operated caps are effective in the case of vehicles for private use, but are not completely suitable for preventing fraudulent removal of fuel from a vehicle to which a plurality of authorized persons have access. An example is the case of haulage companies, car-rental firms and, more in general, all those organizations that have available vehicles that are normally used by different people. In these cases an authorized driver, or at least the person who has the keys of the vehicle at his disposal, can easily open the fuel tank and fraudulently remove therefrom part of the contents. An example of fraud understood in this sense is the case in which the fuel that has been removed is replaced with another liquid, for example water.

Systems have been proposed for detecting opening of the cap of the fuel tank of a vehicle, which are typically pre-arranged for detecting rotation of the cap and generating an alarm signal. For example, GB-A-2343283 describes a remote detection system of this type. In this solution, the movement of the cap is detected by a sensor, and a transmitter circuit consequently sends an alarm signal to a control unit.

In solutions of the type referred to above a part of the detection system is integrated in the gripping portion of the cap. As mentioned previously, in key-operated caps the locking device is designed in such a way that, when the device itself is in the closing condition, the gripping portion is free to rotate even though this does not enable removal of the cap from the filler of the fuel tank and hence removal of fuel: this fact may be the source of false alarms. For instance, if the vehicle is in parked and somebody, for any reason, turns the cap, the system generates an alarm signal, even though in actual fact the cap has not been removed from the filler of the fuel tank and no fraudulent action or removal of fuel is in progress.

SUMMARY OF THE INVENTION

The purpose of present invention is basically to solve the drawbacks referred to, in a simple, reliable, and inexpensive way. Said purpose is achieved, according to the present invention, by a removable cap for vehicles, which presents the characteristics specified in the annexed claims. The claims form an integral part of the technical teaching provided herein in relation to the invention.

BRIEF DESCRIPTION OF THE DRAWINGS

Further purposes, characteristics, and advantages of the present invention will emerge clearly from the ensuing detailed description and from the annexed plates of drawings, which are provided purely by way of explanatory and non-limiting example, and in which:

FIGS. 1 and 2 are schematic plan views, from above and from beneath respectively, of a cap according to the invention;

FIGS. 3 and 4 are exploded schematic views, taken at different angles, of the cap of FIGS. 1 and 2;

DETAILED DESCRIPTION OF PREFERRED EMBODIMENTS OF THE INVENTION

In the figures, the reference number 1 designates as a whole a cap according to the present invention, designed to occlude the filler of a fuel tank of a motor vehicle, such as, for example, a lorry or a bus. The cap 1 comprises a first, gripping, portion, which in use is positioned on the outside of the filler of the fuel tank, and a second, locking, portion, designed to couple with the aforesaid filler.

Figure 5:
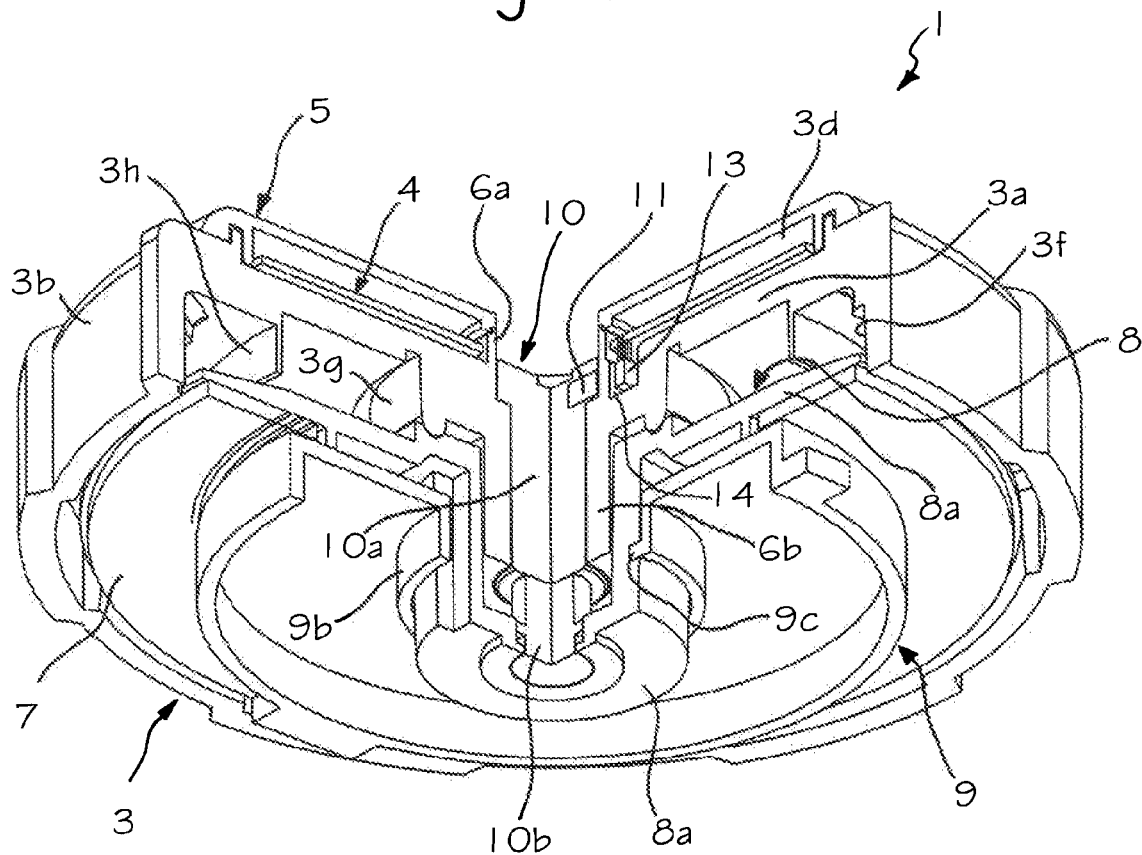
FIG. 5 is a schematic perspective view, in partial cross section, of the cap of FIGS. 1-4.

With reference to FIGS. 3-5, the aforesaid gripping portion comprises a main body, designated by 3, which has a substantially cylindrical shape, with a bottom wall 3a and a peripheral wall 3b on which gripping projections 3c are formed. At the upper end of the body 3, the wall 3a and an end part of the wall 3b delimit a seat 3d, for housing an electronic circuit 4, such as a printed circuit, comprising a plurality of electrical/electronic components. As may be noted, the circuit 4 has a substantially annular configuration, corresponding to that of the seat 3d. From the bottom of the seat 3d there rise projections 3e for positioning the circuit 4, which is purposely provided with respective seats or through holes 4a. The projections 3e are moreover exploited for fixing or positioning of a lid 5 for closing in a sealed way the seat 3d, which completes the aforesaid first part of the cap 1. The body 3 and the lid 5 are, for example, made of moulded thermoplastic material. The seal can be guaranteed by means of the interposition of at least one gasket (not represented) set between the lid 5 and the body 3, which are, for example, engaged or screwed together, or else by welding or gluing of the lid 5 on the body 3, or with any other known technique suitable for the purpose.

Defined in the central region of the body 3 is a generally tubular portion, the upper part 6a of which projects within the seat 3d. The top end of the part 6a is designed to engage a central through hole 5a of the lid 5. The lower part 6b of the aforesaid tubular portion projects, instead, within a lower cavity 3f of the body 3, which is also delimited by the wall 3a and by a respective portion of the wall 3b.

In the non-limiting example illustrated, the lower part 6b of the aforesaid tubular portion is surrounded by a generally cylindrical hollow formation 3g of the body 3, which is located within an area of the cavity 3f circumscribed by a wall 3h, the latter rising from the wall 3a and being concentric to the wall 3b.

Once again with reference to FIGS. 3-5, the aforesaid locking portion of the cap 1 comprises, in the example provided, an intermediate body 8 and an end body 9, set between which is an annular gasket 7, made, for example, of elastomeric material.

The intermediate body 8, made, for example, of moulded thermoplastic material, has a circular base 8a, projecting from the lower part of which is an axially hollow cylindrical portion 8b, which has a seat or an internal axial groove, designated by 8c in FIG. 4, which is designed to receive an engaging projection of a key-locking mechanism or device.

The end body 9, which is preferably made of metal material, is designed to be mechanically coupled to the cylindrical portion 8b, in a known way. As may be noted, the body 9 has a generally annular configuration and defines on the respective peripheral wall two radial appendages 9a. Said appendages 9a provide engagement means, which are designed to co-operate with respective engagement means provided in the filler of the fuel tank, in order to constitute therewith a substantially bayonet-type coupling system. It is to be noted that in another embodiment of the invention, the appendages 9a can be replaced by a threaded attachment or an attachment of some other suitable type. The central part of the body 9, designated by 9b, is substantially tubular and configured for being rendered fixed, in a known way, with respect to the portion 8b of the intermediate body 8, for example, by means of internal projections 9c, which engage in respective seats made on the portion 8b, not represented in FIG. 3 (but one of which is partially visible in FIG. 5). In a possible embodiment, the aforesaid seats on the portion 8b are shaped like axial grooves, in order to enable a certain degree of freedom in the axial direction for the body 9 to allow for any possible compensation of tolerances, but are such as to constrain it in its rotary movement, i.e., in the direction of opening and closing of the cap.

The locking portion of the cap 1 can possibly comprise a terminal, fixed to the end of the cylindrical portion 8b of the body 8, with a spring set between said terminal and the body 9, so as to force the latter, together with the body 8, in the direction of the body 3.

Designated as a whole by 10 is the key-locking device already referred to above, which is of a general conception in itself known in the sector, and hence is illustrated only schematically and described briefly as regards a possible embodiment thereof.

The device 10 can be of the type having a first component, designated by 10a, projecting from which in a radial direction are movable pins (not represented), which can be operated with a respective key. In the component 10a a seat 10c for the key is provided for said purpose. The component 10a is coupled so that it can turn freely on a second component 10b of the device 10. As emerges from FIG. 5, the cavity of the tubular portion 6a-6b has a restriction, defining a contrast surface for a top flange part of the component 10a, whilst the component 10b is constrained to the intermediate body 8, within the cavity of the corresponding tubular portion 8b. By means of the components 10a-10b, therefore, the bodies 3 and 8 are joined to one another in a rotatable way. It should be noted, however, that the device 10 can also be without a component rendered fixed with respect to the part 8, for example, in the case where—as mentioned above—the locking portion of the cap comprises a terminal, fixed to the end of the cylindrical portion 8b of the body 8, with a spring set between said terminal and the body 9.

In their projecting condition, the aforesaid pins mechanically engage the component 10a to the main body 3. When the key is inserted in the locking device 10, it causes displacement of the aforesaid pins towards the inside of the component 10a. The component 10a hence becomes rotatable in the body 3, but without being able to perform complete rotations (for example, only up to approximately 350°). For this purpose appropriate projections and detents are made in the component 10a and in the body 3, in accordance with a technique being in itself known in the field. Once again according to a technique in itself known, the component 10a is provided with a cam profile, which, in the relative rotation between the component 10a and the body 3, radially displaces a further movable component of the locking device 10, which couples (or not, according to the movement imparted by the key) with the seat 8c of the intermediate body 8. In practice, then, in the opening condition of the locking device 10, the bodies 3 and 8 are rendered fixed with respect to one another in rotation by means of the aforesaid further component. Instead, in the opening condition of the locking device 10, the further component is not coupled to the seat 8c, with the body 3 that can hence rotate, but without transferring its own movement to the body 8.

In general terms, therefore, the device 10 is configured in such a way that, in the respective closing condition, any manual rotation imparted on the body 3 cannot be transferred to the body 8. The radial appendages 9a of the body 9 consequently cannot be uncoupled from the part of the bayonet-coupling system formed in the mouth of the fuel tank, thus rendering removal of the cap 1 impossible. Instead, in the opening condition of the device 10, a possible manual rotation imparted on the body 3 can be transferred to the body 8, with the radial appendages 9a of the body 9 that can be disengaged from the part of the bayonet-coupling system formed in the mouth of the fuel tank, thus enabling removal of the cap 1. As has been said, moreover, the general configuration of the device 10 is such that at least the component 10a is free to turn with the body 3, and switching of the device between the conditions of closing and opening can be obtained only by moving said component 10a angularly with respect to the body 3, between a first predefined position and a second predefined position. Said angular movement can be obtained only by inserting the key in the component 10a, the above according a technique known in itself.

According to the main aspect of the invention, the cap 1 is provided with means for detecting the aforesaid relative angular movement between the body 3 and the component 10a of the locking device 10.

In the example illustrated, the detection means comprise an excitation element, carried by the component 10a, and a sensor, which can be excited by means of the aforesaid excitation element, carried by the body 3. More particularly, the excitation element is represented by a body made of magnetic material, designated in the figures by 11, which is positioned in a respective seat 12 formed in the component 10a of the locking device 10. On the other side, the detector is constituted by a magnetic sensor, designated by 13, of a type in itself known, such as, for example, a Hall-effect sensor or a reed sensor, belonging to the circuit 4.

As may be seen in FIG. 5, the sensor 13 is mounted in a position at a side of the component 10a. For this purpose, the sensor 13 projects from the printed circuit 4, within a respective housing 14, formed in the wall 3a of the body 3, substantially aligned with the area of possible displacement of the magnetic element 11, in the course of the angular movement of the component 10a. In the relative angular position between the component 10a and the body 3 that corresponds to the closing condition of the device 10, the magnetic element 11 is set at a distance from the sensor 13 such that the latter is not excited, Instead, following upon passage of the component 10a into the angular position with respect to the body 3 that corresponds to the opening condition of the device 10, the magnetic element 11 is set facing the sensor 13, so as to be able to excite it. Evidently, the configuration can be reversed or in any case be different, for example, with the magnetic element 11 facing the sensor 13 in the closing condition of the device 10. In addition, the sensor 13 could have a configuration different from the one exemplified, for example, suitable for surface mounting (SMD), without having to project significantly from the printed circuit 4, or without the need for a purposely provided housing 14. For this purpose, the element 11 could be mounted and/or oriented in the most appropriate way, for example in an axial direction instead of in a radial direction with respect to the sensor 13.

Figure 6:
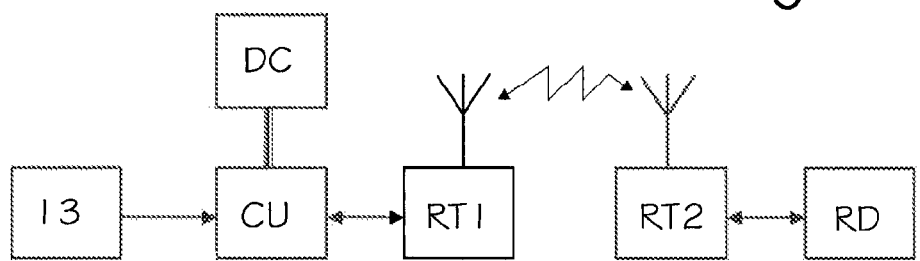
FIG. 6 is a simplified block diagram of a circuit arrangement that equips the cap of FIGS. 1-5.

The electronic circuit 4, schematically represented in the block diagram of FIG. 6, comprises a control unit CU, preferably with microcontroller or ASIC based, operatively connected to the sensor 13. The unit CU is programmed or configured for generating, according to detections made by means of the sensor 13, information or signals, which are, for example encoded ones, which represent the movement of the component 10a with respect to the body 3; i.e., they indicate opening or closing of the locking device 10.

In a possible embodiment, the electronic circuit 4 comprises a data transceiver operating in wireless mode, in particular in RF mode, of a conception in itself known, which is designated by RT1 and is provided for communicating with an external electronic device RD. Transmission of the information can be governed by the control unit CU, for example following upon a change of state of the sensor 13, or else following upon a request received from the outside, for example from the electronic device RD. The electronic device RD can be of a dedicated type and installed on board the vehicle.

Preferably associated to the circuit 4 is a suitable autonomous supply source, represented by one or more batteries DC, for example, of the button type, or else the battery of the vehicle.

In normal use, if the body 3 of the cap 1 is rotated when the locking device 10 is in the respective closing condition, the component 10a turns together with the part 3, and hence the sensor 13 does not make any detection. When, instead, the device 10 is switched into the opening condition with the corresponding key, the component 10a moves angularly with respect to the body 3. Said angular movement is detected by the sensor 13, which generates a signal received by the control unit CU. The change of state of the sensor 13 is communicated by the control unit CU, through the transmission means RT1, to the external electronic device RD, which is provided with a data-communication interface RT2 compatible with the transceiver RT1 of the circuit 4.

The circuit 4 transmits to the device RD the information of opening (and possibly closing) of the cap 1, for example, upon change of state of the sensor 13, or else periodically, for example with a frequency of a few seconds. Alternatively, the device RD sends, by means of the corresponding interface RT2, a query command to the circuit 4, by means of the interface RT1 thereof; the query command can be sent periodically, for example with a frequency of a few seconds. The control unit CU receives, by means of the respective transceiver RT1, the query command and consequently transmits the information on the state of the sensor 13 (cap open or cap closed) to the device RD, through which the corresponding information can be made explicit or processed and retained in a memory.

In a possible embodiment, the communication interface, i.e., the transceivers RT1 and RT2, can be of a telephone type, such as modems of a cellphone type, and the data transmitted can be in the form of short messages, for example, of the SMS or MMS type.

From the foregoing description, the characteristics of the present invention emerge clearly, as likewise its advantages, which are mainly represented by the possibility of preventing any false alarms of opening of the cap of the fuel tank of a vehicle, which are typical of detection systems of a known type. The proposed solution proves constructionally simple and presents a cost that is comparable to that of known solutions.

Of course, without prejudice to the principle of the invention, the details of construction and the embodiments may vary widely with respect to what is described and illustrated herein purely by way of example, without thereby departing from the sphere of protection as defined in the ensuing claims.

It is pointed out, for example, that the type of the means for detecting the angular movement of the component 10a of the locking device 10 could be different from the one exemplified. For example, the detection system could be of an optical type, or else based upon sliding contacts, with modalities of implementation that will appear clear to any person skilled in the field.

The element for exciting the sensor need not be mounted directly in the key-locking device 10, but can be assembled or form part of a further element, which is in turn associated to or mounted on the device 10. Such an additional element could be a plastic ring with a magnet 11, or else a magnetic element having an annular shape, or again an element made of plastoferrite, for example, moulded directly on the movable component of the locking device, etc.

Also the general structure of the cap and of its key-locking mechanism may be different from what is illustrated herein purely by way of example, without thereby departing from the characteristics specified in the ensuing Claim 1. It is pointed out, in particular, that the locking or clamping portion of the cap can be of type equipped with threaded means, which are able to engage with an internal screw made in the filler of the fuel tank.

The invention claimed is:

1. A removable cap for vehicles, of the type designed to occlude a filler of a fuel tank, the cap comprising:
   a first part, having gripping means;
   a second part, having first coupling means, designed to co-operate in a selective way with second coupling means provided at the filler;
   a locking device, switchable between a closing condition and an opening condition by means of a respective key, the device being operatively set between the first part and the second part and being arranged such that:
      in the closing condition, a rotation movement imparted manually upon the first part does not enable disengagement of the first coupling means from the second coupling means;
      in the opening condition, a rotation movement imparted manually upon the first part allows disengagement of the first coupling means from the second coupling means, at least in the closing condition, at least one component of the locking device is rotatable together with the first part, switching with the key of the locking device between the conditions of closing and opening causing an angular movement of said at least one component with respect to the first part, between a first pre-defined angular position and a second pre-defined angular position;

wherein the removable cap further comprises a circuit arrangement including sensor means configured for detecting a relative angular movement between said at least one component of the locking device and the first part of the cap.

2. The cap according to claim 1, wherein the circuit arrangement further comprises a control unit arranged for generating, according to detections made by the sensor means, encoded information or data.

3. The cap according to claim 1, wherein the sensor means comprise an excitation element, which is rotatable together with said at least one component, and a detector designed to be excited by the excitation element.

4. The cap according to claim 3, wherein the excitation element is made of magnetic material and the detector is a magnetic sensor.

5. The cap according to claim 1, wherein the circuit arrangement further comprises communication means, for transmission of information regarding the state of the sensor means.

6. The cap according to claim 5, wherein the communication means comprise a circuit for the transmission and reception of data in a wireless mode.

7. The cap according to claim 1, further comprising a supply source for the circuit arrangement.

8. The cap according to claim 1, wherein the locking device is arranged such that:

in the closing condition, a rotation movement imparted manually upon the first part is not transferred to the second part; and in the opening condition, a rotation movement rotation imparted manually upon the first part is transferred to the second part.

9. The cap according to claim 1, wherein the circuit arrangement comprises a printed circuit having a substantially annular or at least in part arched or curved shape.

10. The cap according to claim 1, wherein the sensor means comprise an excitation element, which is rotatable together with said at least one component, and a detector designed to be excited by the excitation element;

the circuit arrangement further comprises communication means, for transmission of information regarding the state of the sensor means;

the cap further comprises a supply source for the circuit arrangement, and wherein the control unit, the detector, the communication means and the supply source are housed in the cap.

11. The cap according to claim 1, wherein the first part has a seat or cavity for housing at least one of the circuit arrangement or a printed circuit belonging to said circuit arrangement.

12. The cap according to claim 1, wherein the sensor means are optical sensor means or electrical-contact sensor means.

13. The cap according to claim 4, wherein the magnetic sensor is a Hall-effect sensor or a reed sensor.

14. The cap according to claim 6, wherein the communication means comprise a circuit for radio frequency transmission and reception of data.

15. The cap according to claim 7, wherein the supply source includes a battery.

* * * * *